(12) United States Patent
Yang et al.

(10) Patent No.: US 11,967,646 B2
(45) Date of Patent: Apr. 23, 2024

(54) THIN FILM TRANSISTOR STRUCTURE, DISPLAY PANEL AND DISPLAY DEVICE

(71) Applicant: HKC CORPORATION LIMITED, Shenzhen (CN)

(72) Inventors: Keming Yang, Shenzhen (CN); Yizhen Xu, Shenzhen (CN); Chunhui Ren, Shenzhen (CN); Feng Jiang, Shenzhen (CN); Liu He, Shenzhen (CN); Qiang Leng, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/327,217

(22) Filed: Jun. 1, 2023

(65) Prior Publication Data

US 2024/0088298 A1 Mar. 14, 2024

(30) Foreign Application Priority Data

Sep. 9, 2022 (CN) .......................... 202211099065.7

(51) Int. Cl.
| | | |
|---|---|---|
| H01L 29/786 | (2006.01) | |
| G02F 1/1362 | (2006.01) | |
| G02F 1/1368 | (2006.01) | |
| H01L 29/417 | (2006.01) | |

(52) U.S. Cl.
CPC .. *H01L 29/78609* (2013.01); *G02F 1/136222* (2021.01); *G02F 1/1368* (2013.01); *H01L 29/41733* (2013.01); *H01L 29/78696* (2013.01)

(58) Field of Classification Search
CPC ......... H01L 29/78609; H01L 29/41733; H01L 29/78696; G02F 1/136222; G02F 1/1368

USPC ......................................................... 257/288
See application file for complete search history.

(56) References Cited

U.S. PATENT DOCUMENTS

| | | |
|---|---|---|
| 6,310,670 B1 | 10/2001 | Lee |
| 2011/0031492 A1 | 2/2011 | Yamazaki et al. |
| 2011/0157490 A1 | 6/2011 | Morimoto et al. |
| 2016/0005880 A1 | 1/2016 | Tada et al. |

(Continued)

FOREIGN PATENT DOCUMENTS

| | | |
|---|---|---|
| CN | 101165906 A | 4/2008 |
| JP | 2008233148 A | 10/2008 |
| JP | 2009069246 A | 4/2009 |

OTHER PUBLICATIONS

First Office Action issued in counterpart Chinese Patent Application No. 202211099065.7, dated Oct. 24, 2022.

*Primary Examiner* — Tong-Ho Kim
(74) *Attorney, Agent, or Firm* — Westbridge IP LLC

(57) ABSTRACT

Disclosed are a thin film transistor structure, a display panel and a display device. The thin film transistor structure includes a base, a source electrode, a drain electrode configured to connect to a pixel electrode and a grid electrode. The source electrode, the drain electrode and the grid electrode are provided on the base. and a channel is formed between the source electrode and the drain electrode. The thin film transistor structure further includes an insulating layer and a slow-release electrode. The insulating layer is provided on a side of the source electrode and the drain electrode, and filled in the channel. The slow-release electrode is provided in the insulating layer. At least a part of the slow-release electrode is provided inside the channel.

9 Claims, 5 Drawing Sheets

(56) References Cited

U.S. PATENT DOCUMENTS

2017/0154773 A1    6/2017  Zhou et al.
2020/0006506 A1*  1/2020  Lee .................. H01L 29/78645
2020/0089069 A1*  3/2020  Morinaga ............. G02F 1/1368

* cited by examiner

THIN FILM TRANSISTOR STRUCTURE, DISPLAY PANEL AND DISPLAY DEVICE

CROSS-REFERENCE TO RELATED APPLICATIONS

This application claims priority to Chinese Patent Application No. 202211099065.7, filed on Sep. 9, 2022, the entire contents of which are incorporated herein by reference.

TECHNICAL FIELD

The present disclosure relates to the technical field of display technology, in particular to a thin film transistor structure, a display panel and a display device.

BACKGROUND

A thin film transistor (TFT) is widely used in a display panel as a switch of a driving circuit of a pixel unit. The TFT includes a source electrode, a drain electrode and a grid electrode. The grid electrode is connected to the scan line in the display panel, the source electrode is connected to the signal line in the display panel, and the drain electrode is connected to the pixel electrode of the display panel. When the grid electrode is energized, an electric field is generated. The force line of the electric field is directed from the grid electrode to the semiconductor surface between the drain electrode and the source electrode, and generates induced charges on the semiconductor surface. As the voltage loaded on the grid electrode increases, the semiconductor surface will change from a depletion layer to an electron accumulation layer to form an inversion layer until up to a strong inversion, there are carriers flowing in the channel between the source electrode and the drain electrode, to make the source electrode and the drain electrode electrically conducted, thereby energizing the pixel electrode.

After the pixel electrode is energized, it needs to maintain the potential of the pixel electrode for a period of time, which is called a holding phase. The pixel electrode is charged when the grid electrode is energized, and when it enters the holding phase, the grid electrode is powered off. Because the pixel electrode is connected to the drain electrode, the drain electrode has a high potential, but the source electrode has a low potential, there is a relatively high potential difference (hereinafter "voltage difference") between the source electrode and drain electrode. Under the action of this voltage difference, a small amount of carriers remaining in the channel between the source electrode and drain electrode are driven to move, and the pixel electrode produces a leakage current through the drain electrode to the source electrode, that is, the phenomenon that the pixel electrode generates the leakage current appears. However, the problem that the pixel electrode generates the leakage current will cause the potential of the pixel electrode not able to maintain during the holding phase, such that the voltage loaded on the pixel electrode is unstable, the display brightness of the pixel unit corresponding to the pixel electrode is unstable and the display screen of the display panel cannot achieve the desired effect.

In the related art, the leakage problem of the pixel electrode is improved by changing the manufacturing material of the TFT or changing the manufacturing process of the TFT, but these methods have limited improvement on the problem of the pixel electrode producing the leakage current, and it will result in a high defective rate of the display panel because of the high requirements of the material manufacturing process and the complexity of manufacturing process.

SUMMARY

The main objective of the present disclosure is to provide a thin film transistor structure, which aims to decrease the pixel electrode producing the leakage current during the holding phase.

In order to achieve the above objective, the present disclosure provides a thin film transistor structure, including a base, a source electrode, a drain electrode configured to connect to a pixel electrode, a grid electrode, an insulating layer and a slow-release electrode. The source electrode, the drain electrode and the grid electrode are provided on the base, and a channel is formed between the source electrode and the drain electrode. The insulating layer is provided on a side of the source electrode and the drain electrode, and filled in the channel. The slow-release electrode is provided in the insulating layer, and at least a part of the slow-release electrode is provided inside the channel. When the grid electrode is energized, the slow-release electrode is charged; and when the grid electrode is powered off after energized for a while, a voltage difference between the slow-release electrode and the drain electrode is smaller than a voltage difference between the slow-release electrode and the source electrode.

In some embodiments, the slow-release electrode is a sheet structure and provided with a wide surface and a narrow surface; an area of the wide surface is greater than an area of the narrow surface; and the wide surface is provided towards the source electrode or the drain electrode.

In some embodiments, a thickness of the slow-release electrode is less than or equal to 1/10 of a minimum width of the channel.

In some embodiments, the thin film transistor structure further includes a voltage-stabilizing wire provided on the insulating layer; the voltage-stabilizing wire is connected to the slow-release electrode and configured to stabilize a potential of the slow-release electrode when energized; and an energized voltage of the voltage-stabilizing wire is smaller than an energized voltage of the grid electrode to make a potential of the slow-release electrode and a potential of the pixel electrode equivalent.

In some embodiments, the thin film transistor structure further includes at least two slow-release electrodes; each slow-release electrode is a sheet structure, and at least part of the slow-release electrode is provided inside the channel; each slow-release electrode is provided with a wide surface and a narrow surface, an area of the wide surface is greater than an area of the narrow surface, and the wide surface is provided towards the source electrode or the drain electrode; the slow-release electrodes are sequentially distributed at intervals along a direction from the source electrode to the drain electrode; or at least two of the slow-release electrodes are distributed at intervals along a direction perpendicular to a plane where the base is located.

In some embodiments, the thin film transistor structure further includes at least two voltage-stabilizing wires provided on the insulating layer; each voltage-stabilizing wire is connected to each slow-release electrode and configured to stabilize a potential of the slow-release electrode when energized, and an energized voltage of each voltage-stabilizing wire is smaller than an energized voltage of the grid electrode; and the larger a distance between the slow-release electrode and the drain electrode is, the higher a voltage of the voltage-stabilizing wire connected to the slow-release electrode is.

In some embodiments, the thin film transistor structure further includes a plurality of slow-release electrodes; at least part of each slow-release electrode is provided inside the channel; and each slow-release electrode comprises at least one spherical or hollow hemispherical structure.

In some embodiments, the thin film transistor structure further includes a plurality of slow-release electrodes; at least part of the slow-release electrode is provided inside the channel, and each slow-release electrode comprise at least one sub-electrode; and each sub-electrode is provided with a tip end and a surface end, the tip end of each sub-electrode is provided towards the source electrode and the surface end of each sub-electrode is provided towards the drain electrode.

In order to achieve the above objective, the present disclosure further provides a display panel including a color filter, a liquid crystal layer, an array substrate and a plurality of thin film transistor structures. The color filter, the liquid crystal layer and the array substrate are sequentially stacked, and the plurality of the thin film transistor structures are provided in the array substrate.

In order to achieve the above objective, the present disclosure further provides a display device, including a backlight module and the display panel. The array substrate is provided at a light emitting side of the backlight module and the liquid crystal layer is provided at a side of the array substrate away form the backlight module.

In the technical solutions of the present disclosure, an insulating layer is provided at the side of the source electrode and the drain electrode, such that the insulating layer fills and covers the channel between the source electrode and the drain electrode. In addition, the slow-release electrode is provided in the insulating layer, such that the slow-release electrode is at least partially extended into the channel. In this way, when the grid electrode is energized, a large number of carriers flow between the source electrode and the drain electrode. The source electrode is electrically connected to the drain electrode. The slow-release electrode between the source electrode and the drain electrode, and the pixel electrode connected to the drain electrode are charged, and at this time the potentials of the source electrode, drain electrode and slow-release electrode are equal likely. When the grid electrode is powered off, the potential of the source electrode turns to zero, and because the charging time of the slow-release electrode and the charging time of the drain electrode are equal in the state where the grid electrode is energized, such that the amount of charge carried by the slow-release electrode and the drain electrode is equal, the potential of the slow-release electrode is close to the potential of the drain electrode, and the voltage difference between the slow-release electrode and the drain electrode is small. However, because the potential of the source electrode returns to zero, the potential difference between the charged slow-release electrode and the uncharged source electrode is large, and the voltage difference between the slow-release electrode and the source electrode is large. After the pixel unit connected to the drain electrode is fully charged and the grid electrode is powered off, only a small amount of carriers remain in the channel between the source electrode and the drain electrode. Because the voltage difference between the pixel electrode connected to the drain electrode and the slow-release electrode is small, it is not easy for the carriers to move between the pixel electrode and the slow-release electrode, such that the potential of the pixel electrode can be maintained in the holding phase, which can effectively prevent the pixel electrode from producing a leakage current through the drain electrode to the source electrode, such that the leakage current produced by the pixel electrode can be reduced. In addition, there is a large voltage difference between the slow-release electrode and the source electrode, a small amount of carriers remaining in the channel will move under the action of the voltage difference between the slow-release electrode and the source electrode to cause the leakage current, but because the large amount of carriers in the channel have been consumed during the charging phase of the pixel electrode, and the flow of a small amount of carriers will only make a small reduction in the charges on the slow-release electrode, and a small increase in the voltage difference between the slow-release electrode and the drain electrode, such that the voltage difference between the slow-release electrode and the drain electrode is still very small, and the slow-release electrode can still effectively prevent the pixel electrode from producing the leakage current to the slow-release electrode and the source electrode, the potential of the pixel electrode can be effectively maintained and the pixel electrode will not produce the leakage current any more.

BRIEF DESCRIPTION OF THE DRAWINGS

In order to more clearly illustrate the technical solutions in the embodiments of the present disclosure or in the related art, drawings in the embodiments or in the related art will be briefly described below. Obviously, the drawings in the following description are only some embodiments of the present disclosure. Other drawings can be obtained by those skilled in the art according to the structures shown in the drawings without creative work.

Figure 1:
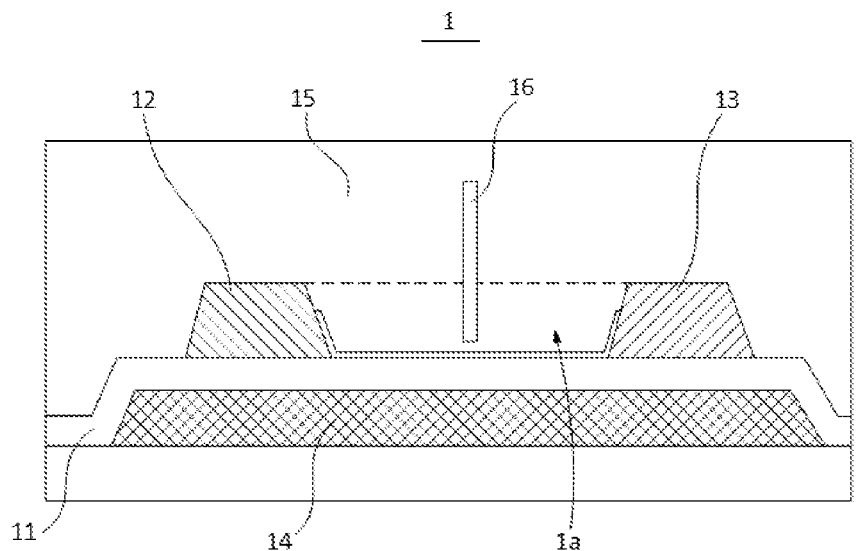
FIG. 1 is a schematic structural view of a thin film transistor structure according to a first embodiment of the present disclosure.

The realization of the purpose, functional characteristics and advantages of the present disclosure will be further described with reference to the attached drawings in combination with embodiments.

DETAILED DESCRIPTION OF THE EMBODIMENTS

The technical solutions of embodiments of the present disclosure will be clearly and completely described with reference to the drawings of the present disclosure. Obviously, the described embodiments are only some rather than all of the embodiments of the present disclosure. Based on the embodiments of the present disclosure, all other embodiments obtained by those skilled in the art without creative efforts shall fall within the scope of the present disclosure.

It should be noted that all directional indicators (such as up, down, left, right, front, rear, etc.) in the embodiments of the present disclosure are only used to explain the relative positional relationship, movement situation, etc. among components in a specific attitude (as shown in the drawings). If the specific attitude changes, the directional indication also changes accordingly.

In the present disclosure, unless otherwise specifically specified and limited, the terms "connected", "fixed", etc. should be understood in a broad sense, for example, "fixed" can be a fixed connection, a detachable connection, or be integrated as a whole; "connected" can be a mechanical connection or an electrical connection; can be directly connected, or indirectly connected through an intermediate medium, or can be the internal communication between two elements or the interaction relationship between two elements. For those skilled in the art, the specific meaning of the terms in the present disclosure can be understood according to specific situations.

In addition, the descriptions related to "first", "second" and the like in the present disclosure are merely for descriptive purposes, and should not be understood as indicating or implying their relative importance or implicitly indicating the number of technical features indicated. Therefore, the features defined by "first" and "second" may explicitly or implicitly include at least one such feature. The meaning of "and/or" appearing in the whole text is the same, and it means to include three parallel plans, taking "A and/or B as an example", including plan A, or plan B, or plan A and B. Besides, the various embodiments can be combined with each other, but the combination must be based on what can be achieved by those skilled in the art. When the combination of the embodiments is contradictory or cannot be achieved, it should be considered that such combination does not exist, or is not within the scope of the present disclosure.

Figure 2:
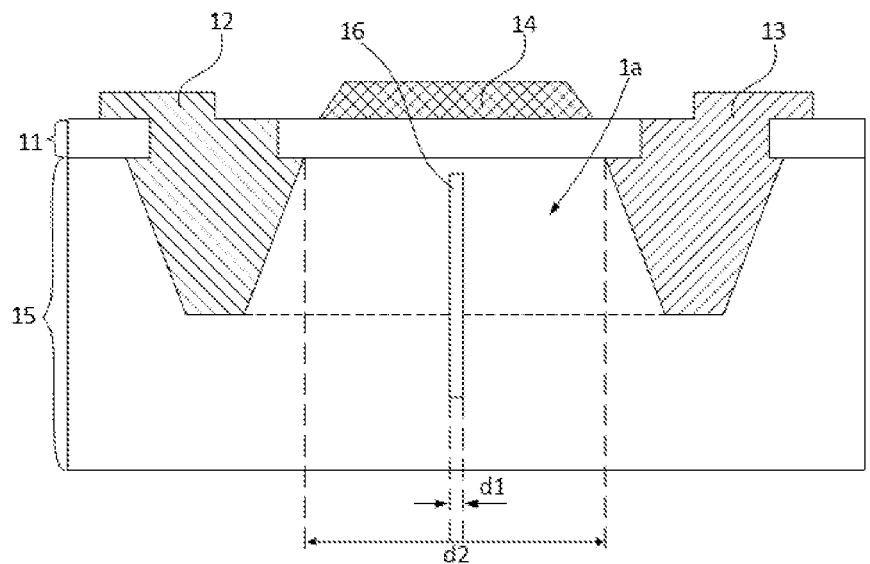
FIG. 2 is a schematic structural view of a thin film transistor structure according to a second embodiment of the present disclosure.

The present disclosure provides a thin film transistor structure 1. As shown in FIG. 1 and FIG. 2, the thin film transistor structure 1 includes a base 11, a source electrode 12, a drain electrode 13 and a grid electrode 14. The source electrode 11, the drain electrode 12 and the grid electrode 13 are provided on the base 11. The drain electrode 13 is configured to connect to a pixel electrode and a channel 1a is formed between the source electrode 11 and the drain electrode 12. The thin film transistor structure 1 further includes an insulating layer 15 and a slow-release electrode 16. The insulating layer 15 is provided on a side of the source electrode 12 and the drain electrode 13 to fill the channel 1a. The slow-release electrode 16 is provided on the insulating layer 15 and at least a part of the slow-release electrode 16 is provided inside the channel 1a.

In some embodiments, the base 11 can be a glass substrate or a resin substrate, the base 11 also generally refers to the glass substrate or the resin substrate, and other film structures (such as a flat layer) disposed on the glass substrate or the resin substrate. The source electrode 12, the drain electrode 13 and the grid electrode 14 are conductive electrodes. The source electrode 12 and the drain electrode 13 are spaced apart on the base 11, and the grid electrode 14 is located between the source electrode 12 and the drain electrode 13. According to different types of thin film transistors, the source electrode 12, the drain electrode 13 and the grid electrode 14 may be differently arranged on the base 11, for example, a bottom-gate thin film transistor is shown in FIG. 1 the grid electrode 14 is provided under the source electrode 12 and drain electrode 13. For example, a coplanar bottom-gate thin film transistor is shown in FIG. 2, the grid electrode, the source electrode and the drain electrode are located at the same height. In the display panel, the grid electrode 14 is used to connect the scan line, the source electrode 12 is used to connect the data line, and the drain electrode 13 is used to connect the pixel electrode. When the grid electrode 14 is energized, carriers flow in the channel 1a, such that the source electrode 12 and the drain electrode 13 are electrically conducted, and the scan line and the data line can be connected to the pixel electrode in the thin film transistor structure 1, thereby controlling the corresponding pixel unit to turn on or turn off.

The slow-release electrode 16 can carry charges. For example, the slow-release electrode 16 is made from a metal conductor or a metal oxide conductor, the slow-release electrode 16 is provided between the source electrode 12 and the drain electrode 13, and a part of the slow-release electrode 16 is accommodated in the channel 1a. In this way, the slow-release electrode 16 can accumulate a part of charges and be charged when carriers flow in the channel 1a. The larger the surface area of the slow-release electrode 16 is, the easier the accumulation of charges is. The slow-release electrode 16 can be in the shape of a strip, a sheet, or a ball, which is not limited here.

In the thin film transistor structure 1 provided in some embodiments, when the grid electrode 14 is energized, a large number of carriers flow between the source electrode 12 and the drain electrode 13, and the source electrode 12 is electrically connected to the drain electrode 13. The slow-release electrode 16 located in the channel 1a between the source electrode 12 and the drain electrode 13, and the pixel electrode connected to the drain electrode 13 are charged, and at this time the potentials of the source electrode 12, the drain electrode 13 and the slow-release electrode 16 are equal likely. When the grid electrode 14 is powered off, the potential of the source electrode 12 turns to zero, and because the charging time of the slow-release electrode 16 and the charging time of the drain electrode 13 are equal in the state where the grid electrode 14 is energized. Thus, the amounts of the charges carried by the slow-release electrode 16 and that carried by the drain electrode 13 are equal, the potential of the slow-release electrode 16 is close to the potential of the drain electrode 13, and the voltage difference between the slow-release electrode 16 and the drain electrode 13 is small. However, because the potential of the source electrode 12 returns to zero, the potential difference between the charged slow-release electrode 16 and the uncharged source electrode 12 is relatively large, and the voltage difference between the slow-release electrode 16 and the source electrode 12 is relatively large. After the pixel unit connected to the drain electrode 13 is fully charged and the grid electrode 14 is powered off, only a small amount of carriers remain in the channel 1a between the source electrode 12 and the drain electrode 13 at this time. Because the voltage difference between the pixel electrode connected to the drain electrode 13 and the slow-release electrode 16 is small, it is difficult for carriers to move between the pixel electrode and the slow-release electrode 16. Thus, the potential of the pixel electrode can be maintained during the holding phase, thereby to effectively prevent the pixel electrode from producing a leakage current through the drain electrode 13 to the source electrode 12, which can reduce the pixel electrode producing the leakage current. In addition, because there is a large voltage difference between the slow-release electrode 16 and the source electrode 12, a small amount of carriers remaining in the channel 1a will move under the action of the voltage difference between the slow-release electrode 16 and the source electrode 12, thereby to cause a leakage current. However, because the carriers in the channel 1a have been consumed in a large amount during the charging phase of the pixel electrode, the flow of a small amount of carriers will only slightly reduce the charged charge on the slow-release electrode 16, and the voltage difference between the slow-release electrode 16 and the drain electrode 13 will only increase slightly, such that the voltage difference between the slow-release electrode 16 and the drain electrode 13 is still very small, and the slow-release electrode 16 can still effectively prevent the pixel electrode from leaking current to the slow-release electrode 16 and the source electrode 12. In this way, the potential of the pixel electrode can be effectively maintained, and the pixel electrode will not leak current further. A buffer layer is used to realize the insulation isolation among the slow-release electrode 16, the source electrode 12 and the drain electrode 13, such that charges on the slow-release electrode 16 are prevented from moving to the source electrode 12 or the drain electrode 13 when the slow-release electrode 16 contacts to the source electrode 12 or the drain electrode 13. Since once the charges on the slow-release electrode 16 move to the source electrode 12 or the drain electrode 13, the potential of the slow-release electrode 16 will reduce, which may not avoid the above pixel electrode from producing the leakage current.

In practical application, the slow-release electrode 16 has various possible structural forms and arrangement methods, which are illustrated below with different embodiments:

First Embodiment

As shown in FIG. 1 and FIG. 2, the slow-release electrode 16 is a sheet structure, the slow-release electrode 16 has a wide surface and a narrow surface, and the wide surface of the slow-release electrode 16 faces the source electrode 12 or the drain electrode 13.

In the embodiment, the slow-release electrode 16 is made into a sheet structure. The slow-release electrode 16 has relatively smooth two side surfaces with a large surface area, that is, the wide surface. The slow-release electrode 16 also has two side surfaces with a small surface area, that is, the narrow surface. Since the wide surface of the slow-release electrode 16 is set to face the source electrode 12 or the drain electrode 13, it is beneficial to make the slow-release electrode 16 receive more carriers flowing in the channel 1a through its wide surface when the grid electrode 14 is energized, such that the slow-release electrode 16 can accumulate more charged charges, and when the grid electrode 14 is powered off, the potential of the slow-release electrode 16 and the potential of the pixel electrode can be as close as possible, and the voltage difference between the slow-release electrode 16 and the pixel electrode is as small as possible, thereby reducing the movement of charged particles between the pixel electrode and the slow-release electrode 16 and reducing the risk of the pixel electrode producing the leakage current as much as possible.

In some embodiments, as shown in FIG. 2, the thickness d1 of the slow-release electrode 16 is less than or equal to $\frac{1}{10}$ of the minimum width d2 of the channel 1a.

In the embodiment, the thickness of the slow-release electrode 16 is compressed to within one-tenth of the minimum width of the channel 1a, the slow-release electrode 16 can obtain a larger surface area, the ability to gather charges can be improved and the charge loss of the slow-release electrode 16 can be reduced meanwhile, such that the potential of the slow-release electrode 16 can maintain equivalent to the potential of the pixel electrode when the grid electrode 14 is energized, and the voltage difference between the slow-release electrode 16 and the pixel electrode is as small as possible, which can reduce the leakage current of the pixel electrode.

Second Embodiment

Figure 3:
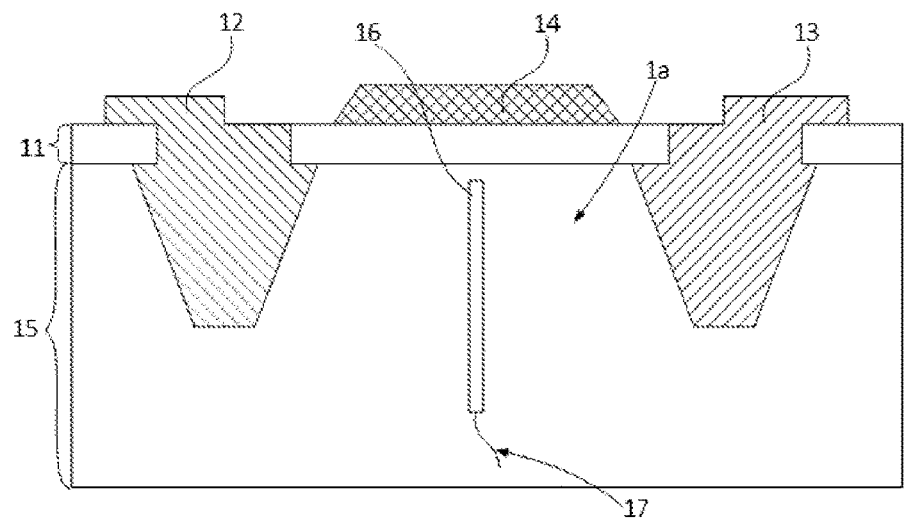
FIG. 3 is a schematic structural view of a thin film transistor structure according to a third embodiment of the present disclosure.

As shown in FIG. 3, different from the first embodiments, the thin film transistor structure 1 in this embodiment also includes a voltage-stabilizing wire 17 provided on the insulating layer 15, and the voltage-stabilizing wire 17 is connected to the slow-release electrode 16 and configured to stabilize a potential of the slow-release electrode 16 when energized.

In the embodiment, after the charging of the pixel electrode is completed and the grid electrode 14 is powered off, the potential of the source electrode 12 is close to zero at this time, the potential of the slow-release electrode 16 is far greater than the potential of the source electrode 12. A small amount of carriers still remaining in the channel 1a will flow under the action of the voltage difference between the slow-release electrode 16 and the source electrode 12. Thus, the slow-release electrode 16 generates the leakage current towards the source electrode 12, and the carriers remaining in the channel 1a also are depleted. Meanwhile, the potential of the slow-release electrode 16 reduces, the voltage difference between the slow-release electrode 16 and the pixel electrode becomes larger, and the pixel electrode generates the leakage current toward the slow-release electrode 16. Therefore, in this embodiment, a voltage is applied on the slow-release electrode 16 through the voltage-stabilizing wire 17, such that the slow-release electrode 16 can maintain a potential equivalent to that of the pixel electrode, thereby reducing the voltage difference between the slow-release electrode 16 and the pixel electrode after a small amount of the current is leaked, to avoid the above problem of the pixel electrode producing the current leakage, and then to ensure the stability and reliability of the pixel unit during displaying. The voltage applied on the slow-release electrode 16 through the voltage stabilizing wire 17 should be lower than the energized voltage of the grid electrode 14 to avoid the potential of the slow-release electrode 16 from being higher than the potential of the pixel electrode. Since once the potential of the slow-release electrode 16 is higher than the potential of the pixel electrode, the slow-release electrode 16 will charge the pixel electrode, the voltage loaded on the pixel electrode will rise, to result in that the pixel electrode is overcharged and damaged, or the brightness of the pixel unit corresponding to the pixel electrode increases, which may result in the problem that the display brightness of the pixel unit is uneven and difficult to control.

Third Embodiment

Figure 4:
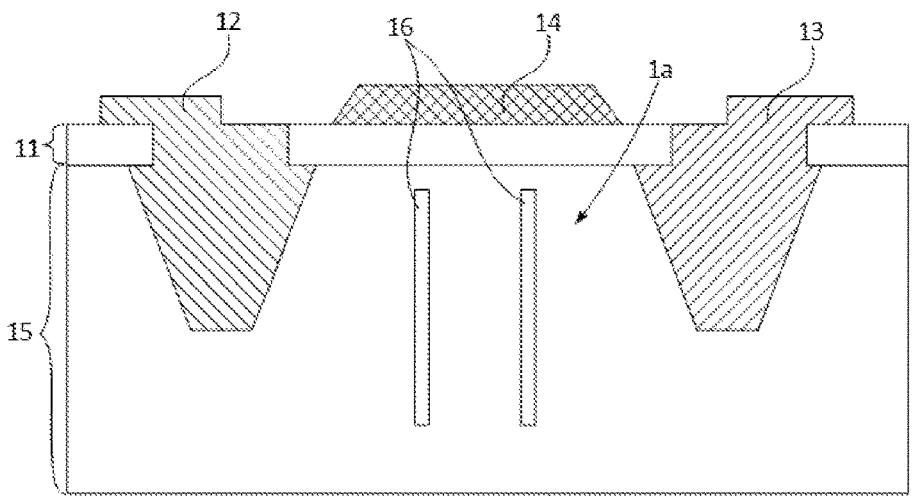
FIG. 4 is a schematic structural view of a thin film transistor structure according to a fourth embodiment of the present disclosure.
Figure 5:
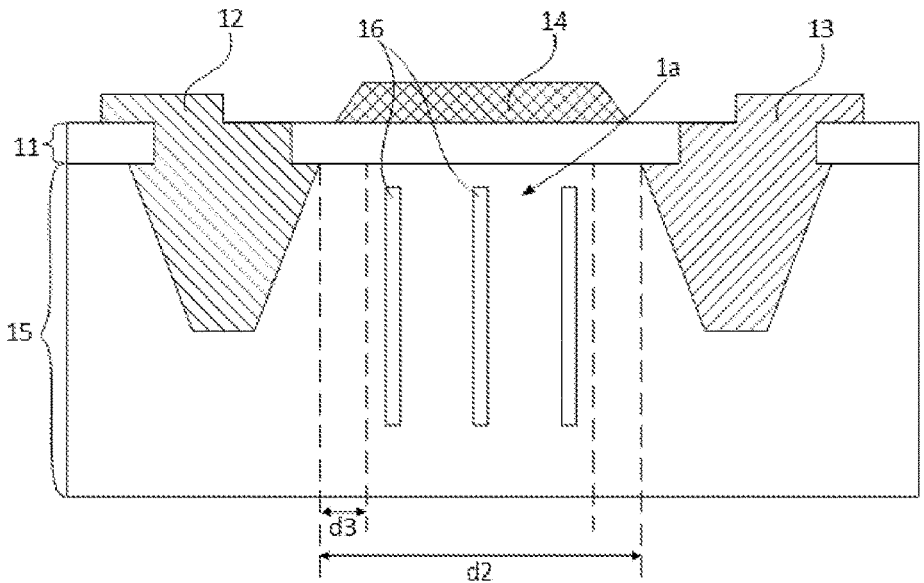
FIG. 5 is a schematic structural view of a thin film transistor structure according to a fifth embodiment of the present disclosure.
Figure 6:
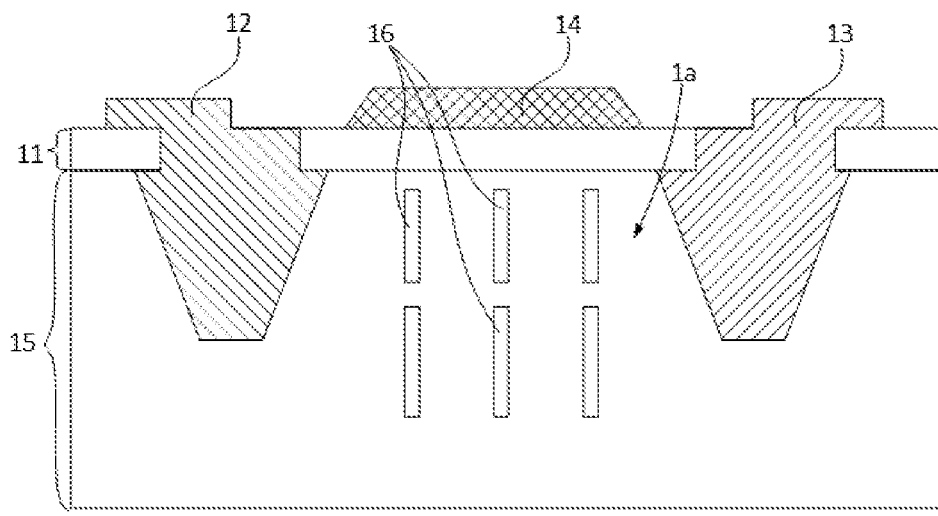
FIG. 6 is a schematic structural view of a thin film transistor structure according to a sixth embodiment of the present disclosure.

As shown in FIG. 4 to FIG. 6, the thin film transistor structure 1 includes at least two slow-release electrodes 16 and each slow-release electrode 16 is a sheet structure. At least part of the slow-release electrode 16 is provided inside the channel 1a. Each slow-release electrode 16 is provided with a wide surface and a narrow surface, an area of the wide surface is greater than an area of the narrow surface, and the wide surface faces the source electrode 12 or the drain electrode 13. Each slow-release electrode 16 is extended along the direction perpendicular to the plane where the base 11 is located. As shown in FIG. 4 and FIG. 5, the slow-release electrodes 16 are sequentially distributed at intervals along a direction from the source electrode 12 to the drain electrode 13; or as shown in FIG. 6, at least two of the slow-release electrodes 16 are distributed at intervals along a direction perpendicular to the plane where the base 11 is located.

In the embodiment, the slow-release electrode 16 is made into a sheet structure, such that the slow-release electrode 16 has a larger surface area. Meanwhile, the two wide surfaces of the slow-release electrode 16 with larger surface areas face the source electrode 12 and the drain electrode 13 respectively, which is beneficial to make the slow-release electrode 16 receive more carriers flowing in the channel 1a through the two wide surfaces when the grid electrode 14 is energized, such that the slow-release electrode 16 can accumulate more charged charges. When the grid electrode 14 is powered off, the potential of the slow-release electrode 16 and the potential of the pixel electrode can be as close as possible, the voltage difference between the slow-release electrode 16 and the pixel electrode can be as small as possible, and then the movement of the charged particles between the pixel electrode and slow-release electrodes 16 can be reduced, thereby reducing the risk of pixel electrode producing the leakage current as much as possible.

As shown in FIG. 4 and FIG. 5, in this embodiment, since at least two slow-release electrodes 16 are provided side by side in the channel 1a, and each slow-release electrode 16 and the pixel electrode can be charged simultaneously when the grid electrode 14 is energized. When the grid electrode 14 is powered off, each slow-release electrode 16 has the same potential, and because there is a large voltage difference between the source electrode 12 and the slow-release electrode 16 close to the source electrode 12, the slow-release electrode 16 close to the source electrode 12 will generate the leakage current towards the source electrode 12, and the remaining carriers in the channel 1a will be depleted meanwhile. In this way, the slow-release electrode 16 close to the drain electrode 13 can maintain the potential during charging, then the slow-release electrode 16 close to the drain electrode 13 can maintain the same potential to the pixel electrode, such that the voltage difference between the pixel electrode and the slow-release electrode 16 close to the drain electrode 13 is very small, and the pixel electrode is less prone to produce electric leakage, which may result in that the potential of the pixel electrode can be maintained stably, and the display effect of the pixel unit can become more stable accordingly. As shown in FIG. 5, when multiple slow-release electrodes 16 are arranged in the channel 1a, the distance (minimum distance) between the drain electrode 13 and the slow-release electrode 16 closest to the drain electrode 13, and the distance between the source electrode 12 and the slow-release electrode 16 closest to the source electrode 12 are greater than or equal to ¼ of the minimum width of the channel 1a, thereby avoiding a electrical breakdown between the slow-release electrode 16 and the source electrode 12 or the drain electrode 13 caused by a quite small distance between the slow-release electrode 16 and the source electrode 12 or the drain electrode 13. In addition, the problem that the source electrode 12 and the drain electrode 13 are short-circuited because they are connected to a plurality of slow-release electrodes 16, and the problem of the pixel electrode producing the leakage current cause by the failure of the slow-release electrodes 16 are avoided.

As shown in FIG. 6, in this embodiment, since at least two slow-release electrodes 16 are provided at intervals vertically in the channel 1a, the space in the channel 1a can be fully used. For example, when the channel 1a has a trapezoidal cross-section, a small number of slow-release electrodes 16 are set near the bottom wall of the channel 1a, and a large number of slow-release electrodes 16 are set near the lower opening of the channel 1a. Thus, the utilization rate of the space in the channel 1a can be improved, and the layout of the slow-release electrodes 16 can be more widely applicable to thin film transistors of different sizes.

Fourth Embodiment

Figure 7:
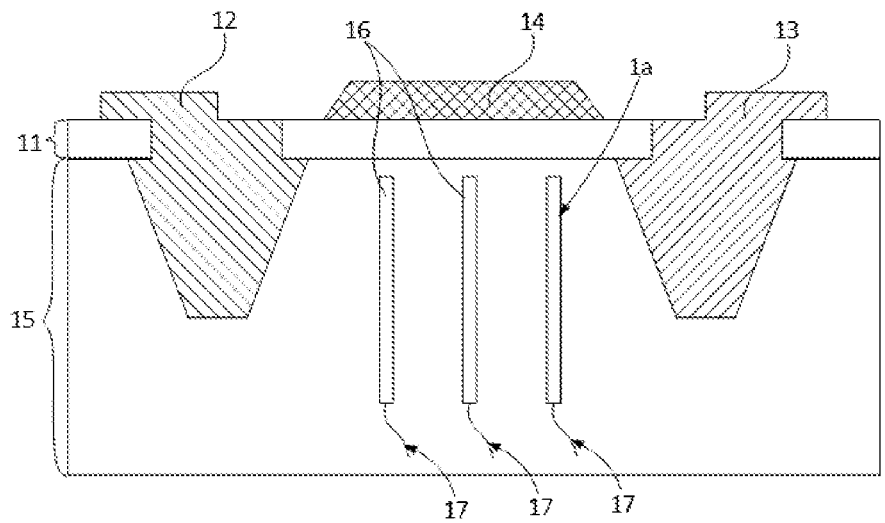
FIG. 7 is a schematic structural view of a thin film transistor structure according to a seventh embodiment of the present disclosure.

As shown in FIG. 7, different from the previous embodiment, in this embodiment, the film transistor structure further includes at least two voltage-stabilizing wires 17 provided on the insulating layer 15, each slow-release electrode 16 is connected to each voltage-stabilizing wire 17 and configured to stabilize a potential of the slow-release electrode 16 when energized, and the larger the distance between a slow-release electrode 16 and the drain electrode 13 is, the higher a voltage of a voltage-stabilizing wire 17 connected to the slow-release 16 is.

In this embodiment, after the charging of the pixel electrode is completed and the grid electrode 14 is powered off, the potential of the source electrode 12 is basically zero at this time, the potential of the slow-release electrode 16 is far greater than the potential of the source electrode 12, and a small amount of carriers will still remain in the channel 1a. Under the action of the voltage difference between the slow-release electrode 16 and the source electrode 12, charged particles in channel 1a flow and the slow-release electrode 16 will generate a leakage current to the source electrode 12. Meanwhile, the remaining carriers in the channel 1a are exhausted, the potential of the slow-release electrode 16 decreases at this time, the voltage difference between the slow-release electrode 16 and the pixel electrode becomes larger, and the pixel electrode may generate a leakage current toward the slow-release electrode 16. Therefore, in this embodiment, a voltage is loaded on the slow-release electrode 16 through the voltage-stabilizing wire 17, such that the slow-release electrode 16 can maintain a potential equal to that of the pixel electrode, thereby reducing the voltage difference between the slow-release electrode 16 and the pixel electrode after a small amount of leakage, thereby avoiding the above leakage problem of the pixel electrode, and then ensuring the stability and reliability of the pixel unit during displaying.

In this embodiment, at least two voltage-stabilizing wires 17 are used to supply power to each slow-release electrode 16 at the same time, such that each slow-release electrode 16 can maintain different potentials. The potential of the slow-release electrode 16 closer to the source electrode 12 is lower, and the potential of the slow-release electrode 16 closer to the drain electrode 13 is higher, such that the slow-release electrodes 16 form a gradient potential in turn, and a low voltage difference between the source electrode 12 and the slow-release electrode 16 near the source electrode 12 is maintained, a low voltage difference between the adjacent slow-release electrodes 16 is maintained, and a low voltage difference between the slow-release electrodes 16 and the drain electrode 13 is also maintained. Thus, the current leakage caused by the voltage difference among the slow-release electrode 16, the source electrode 12 and the drain electrode 13 can be reduced as possible, and the current leakage caused by the voltage difference between the adjacent slow-release electrode 16 can be reduced as much as possible. Therefore, in this thin film transistor structure, where may the leakage current appear can be controlled, to reduce the influence of the electric leakage on the display of the pixel unit as much as possible.

Fifth Embodiment

Figure 8:
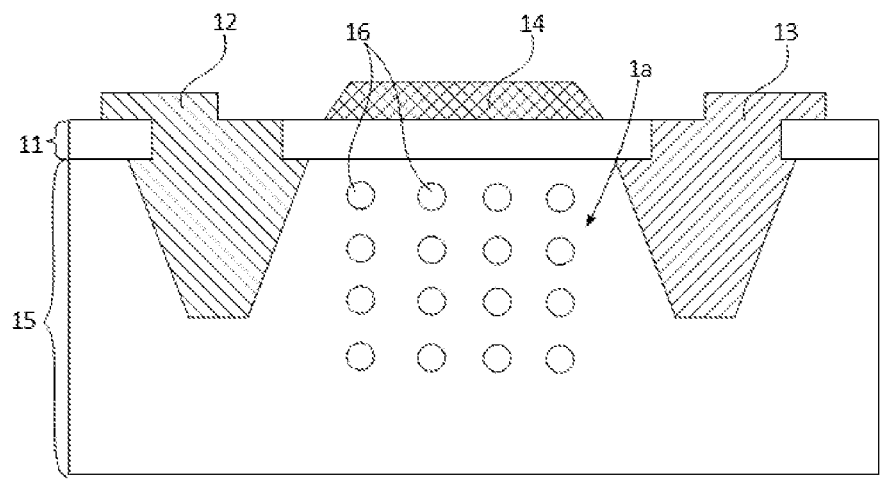
FIG. 8 is a schematic structural view of a thin film transistor structure according to a eighth embodiment of the present disclosure.
Figure 9:
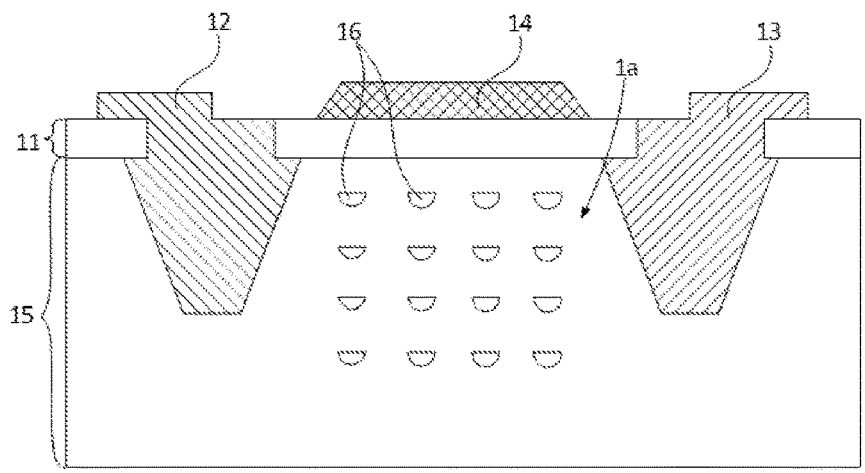
FIG. 9 is a schematic structural view of a thin film transistor structure according to a ninth embodiment of the present disclosure.

As shown in FIG. 8 and FIG. 9, the film transistor structure 1 further includes a plurality of slow-release electrodes 16, at least part of the slow-release electrode 16 is provided inside the channel, and each slow-release electrode 16 includes at least one spherical or hollow hemispherical structure.

In this embodiment, the hollow hemisphere structure refers to a hemisphere whose inside is hollowed out, and the cross-section is U-shaped, such that the hemisphere can have two curved surfaces, that is, the inner surface and the outer surface, which can increase the surface area of the slow-release electrode 16 as much as possible. By setting the slow-release electrode 16 as a sphere or a hollow hemispherical structure, the slow-release electrode 16 can be made to have a larger surface area, such that the slow-release electrode 16 can receive more carriers flowing in the channel 1a when the grid electrode 14 is energized and the slow release electrode 16 can accumulate more charged charges. When the grid electrode 14 is powered off, the potential of the slow-release electrode 16 and that of the pixel electrode can be as close as possible, the voltage difference between the slow-release electrode 16 and the pixel electrode can be as small as possible, and then the movement of the charged particles between the pixel electrode and the slow-release electrode 16 can be reduced, thereby to reduce the risk of the pixel electrode producing the leakage current as much as possible. In addition, the shape of the sphere and the hollow hemisphere is easy to process, and it is also convenient to fill the channel 1a, which is beneficial to reduce the difficulty of manufacturing the thin film transistor. Each slow-release electrode 16 can be a sphere or a hollow hemispherical structure, or the slow-release electrode 16 can be a multi-segment electrode layer composed of two or more electrodes in the shape of a sphere or a hollow hemisphere. For example, as shown in FIG. 8, four spherical electrodes arranged side by side form an electrode layer of the slow-release electrode 16, and each of these four spherical electrodes becomes an electrode segment of the slow-release electrode 16. For another example, as shown in FIG. 9, four hollow hemispherical electrodes vertically arranged side by side form an electrode layer of the slow-release electrode 16, and each of the four hollow hemispherical electrodes becomes an electrode segment of the slow-release electrode 16.

Sixth Embodiment

Figure 10:
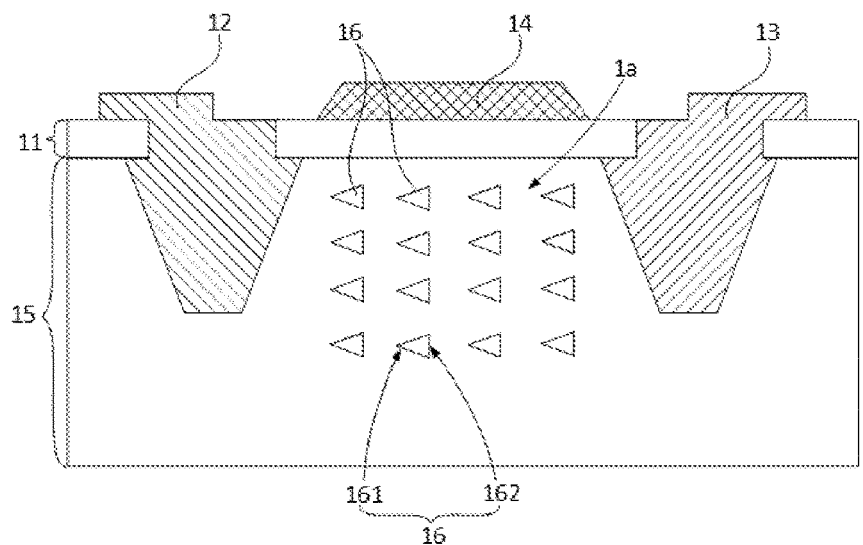
FIG. 10 is a schematic structural view of a thin film transistor structure according to a tenth embodiment of the present disclosure.

As shown in FIG. 10, the film transistor structure 1 further includes a plurality of slow-release electrodes 16 and at least part of the slow-release electrode 16 is provided inside the channel 1a, and each slow-release electrode 16 include at least one sub-electrode. Each sub-electrode is provided with a tip end 161 and a surface end, the tip end 161 of each sub-electrode faces the source electrode 12 and the surface end of each sub-electrode faces the drain electrode 13.

In this embodiment, the sub-electrode in the slow-release electrode 16 is made into a structure with a tip end 161 and a surface end. The tip end 161 is a raised vertex structure on the sub-electrode, and the surface end is a plane or curved surface structure on the sub-electrode. The principle that the tip 161 is easy to discharge is applied to the embodiment, such that the tip end 161 of the slow-release electrode 16 is uniformly directed towards the source electrode 12, and the surface end is uniformly directed towards the drain electrode 13. In this way, after the charging of the pixel electrode is completed, the slow-release electrode 16 is easy to generate a leakage current under the action of the large voltage difference between the slow-release electrode 16 and the source electrode 12 through the tip end 161 of the sub-electrode, and the remaining carriers are quickly depleted in the channel 1a, which makes the potential of the slow-release electrode 16 stable more quickly and further makes the voltage difference between the slow-release electrode 16 and the pixel electrode stable more quickly to improve the stability of the display effect of the corresponding display unit. Each slow-release electrode 16 may only contain one sub-electrode, and at this time, the sub-electrode becomes a separate slow-release electrode 16. Each slow-release electrode 16 may also include two or more sub-electrodes, and at this time, the slow-release electrode 16 is an electrode layer including a multi-segment electrode. For example, as shown in FIG. 10, four sub-electrodes arranged side by side horizontally or vertically form an electrode layer of the slow-release electrode 16, and each of the four sub-electrodes becomes an electrode segment in the slow-release electrode 16.

Figure 11:
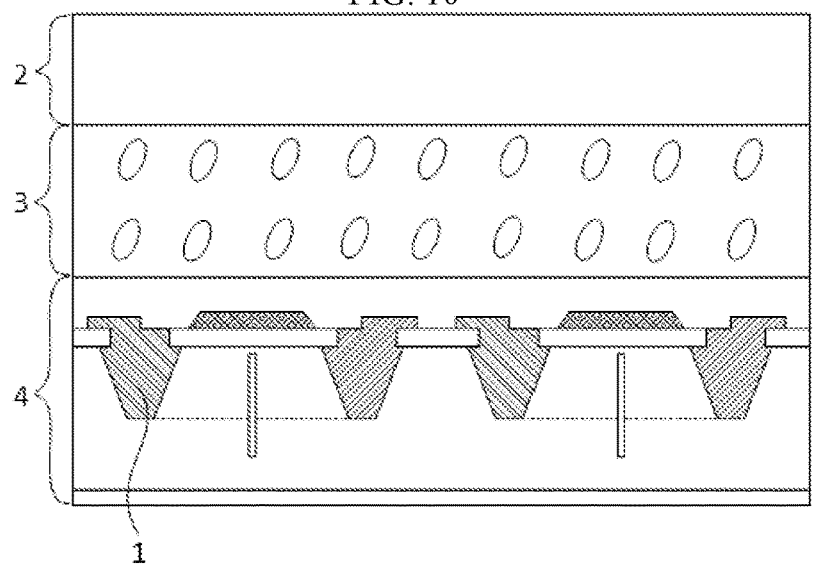
FIG. 11 is a schematic structural view of a display panel according to some embodiments of the present disclosure.

The present disclosure also provides a display panel. As shown in FIG. 11, the display panel includes a color filter 2, a liquid crystal layer 3, an array substrate 4, and a plurality of the thin film transistor structures 1. The color filter 2, the liquid crystal layer 3 and the array substrate 4 are stacked in sequence, and a plurality of thin film transistor structures 1 are provided on the array substrate 4.

In this embodiment, the array substrate 4 and the color filter 2 are enclosed by a plastic frame to form a liquid crystal cell and liquid crystal is filled in the liquid crystal cell to form the liquid crystal layer 3. The color filter 2, the array substrate 4 and the liquid crystal layer 3 constitute a liquid crystal display device. The thin film transistor is provided in the array substrate 4 and are used to control the power on/off of the driving circuit in the display panel. The specific structure of the thin film transistor in this embodiment refers to the above-mentioned embodiments. Since this display panel adopts all the technical solutions of all the above-mentioned embodiments, it at least has all the beneficial effects brought by the technical solutions of the above-mentioned embodiments, which is not repeat here.

Figure 12:
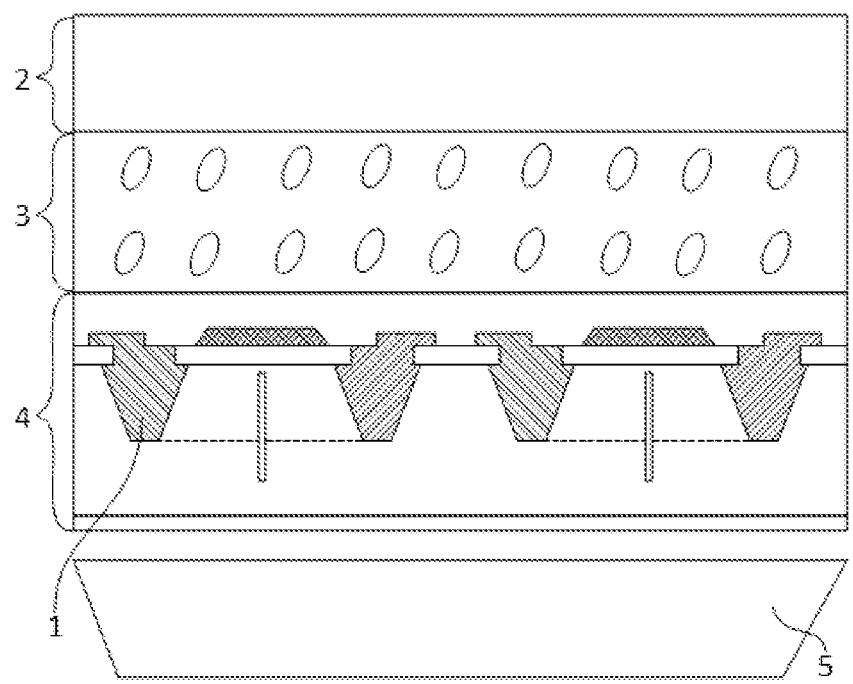
FIG. 12 is a schematic structural view of a display device according to some embodiments of the present disclosure.

The present disclosure also provides a display device. As shown in FIG. 12, the display device includes a backlight module 5 and the display panel. The array substrate 4 is provided at the light emitting side of the backlight module 5, and the liquid crystal layer 3 is provided at a side of the backlight module 5.

In this embodiment, the backlight module 5 is used to provide a backlight source for the display panel. The backlight module 5 is provided with a point light source and a dimming film such as a dodging film and a diffusion film. The point light source is converted into a surface light source to illuminate the display panel. The specific structure of the display panel in this embodiment refers to the above-mentioned embodiments. Since this display device adopts all the technical solutions of all the above-mentioned embodiments, it at least has all the beneficial effects brought by the technical solutions of the above-mentioned embodiments, which is not repeat here.

The above are only some embodiments of the present disclosure, and do not limit the scope of the present disclosure. Under the concept of the present disclosure, equivalent structural transformations made according to the description and drawings of the present disclosure, or direct/indirect application in other related technical fields are included in the scope of the present disclosure.

What is claimed is:

1. A thin film transistor structure, comprising:
a base;
a source electrode;
a drain electrode configured to connect to a pixel electrode;
a grid electrode;
an insulating layer;
a slow-release electrode;
wherein the source electrode, the drain electrode and the grid electrode are provided on the base, and a channel is formed between the source electrode and the drain electrode;
the insulating layer is provided on a side of the source electrode and the drain electrode, and filled in the channel;
the slow-release electrode is provided in the insulating layer, and at least a part of the slow-release electrode is provided inside the channel; and
when the grid electrode is energized, the slow-release electrode is charged; and when the grid electrode is powered off after energized, a voltage difference between the slow-release electrode and the drain electrode is smaller than a voltage difference between the slow-release electrode and the source electrode,
the thin film transistor structure further comprises a plurality of slow-release electrodes;
wherein at least part of each slow-release electrode is provided inside the channel; and
each slow-release electrode comprises at least one spherical or hollow hemispherical structure.

2. The thin film transistor structure of claim 1, wherein:
the slow-release electrode is a sheet structure and provided with a wide surface and a narrow surface;
an area of the wide surface is greater than an area of the narrow surface; and
the wide surface is provided towards the source electrode or the drain electrode.

3. The thin film transistor structure of claim 2, wherein a thickness of the slow-release electrode is less than or equal to 1/10 of a minimum width of the channel.

4. The thin film transistor structure of claim 2, further comprising a voltage-stabilizing wire provided on the insulating layer;

wherein the voltage-stabilizing wire is connected to the slow-release electrode and configured to stabilize a potential of the slow-release electrode when energized; and
an energized voltage of the voltage-stabilizing wire is smaller than an energized voltage of the grid electrode to make a potential of the slow-release electrode and a potential of the pixel electrode equivalent.

5. The thin film transistor structure of claim 1, further comprising at least two slow-release electrodes;
wherein each slow-release electrode is a sheet structure, and at least part of the slow-release electrode is provided inside the channel;
each slow-release electrode is provided with a wide surface and a narrow surface, an area of the wide surface is greater than an area of the narrow surface, and the wide surface is provided towards the source electrode or the drain electrode;
the slow-release electrodes are sequentially distributed at intervals along a direction from the source electrode to the drain electrode; or
at least two of the slow-release electrodes are distributed at intervals along a direction perpendicular to a plane where the base is located.

6. The thin film transistor structure of claim 5, further comprising at least two voltage-stabilizing wires provided on the insulating layer;
wherein each voltage-stabilizing wire is connected to each slow-release electrode and configured to stabilize a potential of the slow-release electrode when energized, and an energized voltage of each voltage-stabilizing wire is smaller than an energized voltage of the grid electrode; and
the larger a distance between the slow-release electrode and the drain electrode is, the higher a voltage of the voltage-stabilizing wire connected to the slow-release electrode is.

7. The thin film transistor structure of claim 1, further comprising a plurality of slow-release electrodes;
wherein at least part of the slow-release electrode is provided inside the channel, and each slow-release electrode comprise at least one sub-electrode; and
each sub-electrode is provided with a tip end and a surface end, the tip end of each sub-electrode is provided towards the source electrode and the surface end of each sub-electrode is provided towards the drain electrode.

8. A display panel, comprising a color filter, a liquid crystal layer, an array substrate and a plurality of thin film transistor structures of claim 1,
wherein the color filter, the liquid crystal layer and the array substrate are sequentially stacked, and the plurality of the thin film transistor structures are provided in the array substrate.

9. A display device, comprising a backlight module and the display panel of claim 8,
wherein the array substrate is provided at a light emitting side of the backlight module and the liquid crystal layer is provided at a side of the array substrate away form the backlight module.

* * * * *